United States Patent
Chang et al.

(10) Patent No.: US 12,409,612 B2
(45) Date of Patent: Sep. 9, 2025

(54) BONDING METHOD AND APPARATUS OF SUBSTRATES

(71) Applicant: SKY TECH INC., Hsinchu County (TW)

(72) Inventors: Jung-Hua Chang, Hsinchu County (TW); Pei-Yun Chiang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 139 days.

(21) Appl. No.: 18/373,270

(22) Filed: Sep. 26, 2023

(65) Prior Publication Data
US 2025/0100232 A1  Mar. 27, 2025

(51) Int. Cl.
*B29C 65/48*  (2006.01)

(52) U.S. Cl.
CPC .... *B29C 65/4825* (2013.01); *B29C 2791/006* (2013.01)

(58) Field of Classification Search
CPC .......... B29C 65/4825; B29C 2791/006; B29C 66/342; B29C 66/00145
USPC .............. 156/60, 87, 285, 286, 312; 269/43; 438/455, 459, 909, 974, 976, 977
See application file for complete search history.

(56) References Cited

U.S. PATENT DOCUMENTS

| | | | | |
|---|---|---|---|---|
| 4,283,242 A | * | 8/1981 | Regler | H01L 21/302 156/154 |
| 4,316,757 A | * | 2/1982 | Walsh | B24B 37/30 156/154 |
| 5,602,058 A | * | 2/1997 | Ooizumi | B25B 11/007 156/286 |

* cited by examiner

*Primary Examiner* — Philip C Tucker
*Assistant Examiner* — Brian R Slawski
(74) *Attorney, Agent, or Firm* — Chun-Ming Shih; HDLS IPR SERVICES

(57) ABSTRACT

A bonding method of substrates for bonding a first substrate and a second substrate. The method includes: placing the first substrate on a holding surface of a holder in a confined chamber; evacuating air from the confined chamber to vacuum the confined chamber to a predetermined low pressure value; placing the second substrate on a top of the first substrate; pressing to the second substrate onto the first substrate; and allowing an outside atmosphere air to slowly enter the confined chamber by a first flow coefficient; and allowing the outside atmosphere air to rapidly enter the confined chamber with a second flow coefficient, wherein the second flow coefficient is greater than the first flow coefficient.

9 Claims, 7 Drawing Sheets

BONDING METHOD AND APPARATUS OF SUBSTRATES

BACKGROUND

Technical Field

This disclosure relates to bonding substrates, and in particular, to a bonding method and bonding apparatus of substrates.

Related Art

In the wafer process, an adhesive is applied to bonding two substrates before processing the substrates. Take the wafer thinning process as an illustration, the wafer to be thinned has insufficient stress strength and is prone to breakage. Therefore, before thinning process, the wafer is bonded to a carrier plate, so as to enhance the mechanical strength of the wafer. And then wafer is then subjected to thinning operations such as chemical-mechanical grinding.

As described above, the wafer and the carrier plate are bonded through the adhesive. The adhesive must be sufficiently coated to the wafer and the carrier plate, and air between the wafer and the carrier plate has to be evacuated, so as to prevent air bubbles in the adhesive from affecting the bonding strength.

The existing practice is to place the wafer and carrier plate in a confined chamber during the bonding process. When applying pressure to the two substrates, the confined chamber is simultaneously vacuumed to a low pressure. The air bubbles are attracted by the low pressure towards the edge of the substrates, and then the air between the wafer and the carrier plate is removed from the edge of the substrates.

However, During the process of restoring the pressure in the confined chamber to atmospheric pressure (equilibrium with the outside atmospheric pressure), Air can re-enter between the wafer and the carrier plate and form new air bubbles affecting the bonding strength.

SUMMARY

In view of the above problem, this disclosure discloses a bonding method and apparatus for substrates, which is able to fully remove the air between the two substrates being bonded.

This disclosure discloses a bonding method of substrates for bonding a first substrate and a second substrate. The method comprises: placing the first substrate on a holder in a confined chamber; evacuating air from the confined chamber to vacuum the confined chamber to a predetermined low pressure value; placing the second substrate on a top of the first substrate; pressing to the second substrate onto the first substrate; and allowing an outside atmosphere air to slowly enter the confined chamber by a first flow coefficient; and allowing the outside atmosphere air to rapidly enter the confined chamber with a second flow coefficient, wherein the second flow coefficient is greater than the first flow coefficient.

In one or more embodiments, the step of providing the confined chamber comprises: providing a vacuum container, wherein the confined chamber is defined within the confined chamber.

In one or more embodiments, the first substrate is placed on a holding surface of the holder at first, wherein the holder is disposed on a bottom of the vacuum container with the holding surface facing a top of the vacuum container.

In one or more embodiments, the step of evacuating air from the confined chamber comprises: connecting a vacuum pump to the confined chamber by an air evacuation pipe and evacuating air by the vacuum pump.

In one or more embodiments, the step of pressing the second substrate comprises: disposing a bonding head to the top of the vacuum container in a movable manner, allowing the bonding head to move toward the holder to contact and press the second substrate.

In one or more embodiments, the step of allowing the outside atmosphere air to enter the confined chamber comprises: connecting a two-stage valve assembly to the confined chamber via an air inlet pipe; wherein a flow coefficient of the two-stage valve assembly is configured to be selectively switched into a first flow coefficient and a second flow coefficient, and the second flow coefficient is greater than the first flow coefficient.

In one or more embodiments, the two-stage valve assembly includes: a first shut-off valve and a throttle valve connected in series with the air inlet pipe, wherein the first shut-off valve is disposed between the air inlet pipe and the throttle valve, and an equivalent flow coefficient of the first shut-off valve and the throttle valve connected in series equals the first flow coefficient; and a second shut-off valve with two ends respectively connected to an inlet end of the first shut-off valve and an outlet end of the throttle valve, and when the first shut-off valve and the second shut-off valve simultaneously open, an equivalent flow coefficient equals the second flow coefficient.

In one or more embodiments, when allowing the outside atmosphere air to enter the confined chamber by the first flow coefficient, the first shut-off valve is opened to allow the outside atmosphere air to enter the confined chamber via the throttle valve and the first shut-off valve.

In one or more embodiments, when allowing the outside atmosphere air to enter the confined chamber by the second flow coefficient, the second shut-off valve is opened to allow the outside atmosphere air to enter the confined chamber simultaneously via the first shut-off valve, the second shut-off valve, and the throttle valve.

In one or more embodiments, the bonding method further comprises applying an adhesive to the first substrate or the second substrate, to allow the adhesive to be disposed between the first substrate and the second substrate.

This disclosure further discloses a bonding apparatus of substrates for bonding a first substrate and a second substrate, bonding apparatus comprises: a vacuum container having a confined chamber defined therein, wherein the confined chamber is configured to dispose the first substrate and the second substrate therein; a bonding head disposed to the vacuum container and located in the confined chamber, wherein the bonding head is configured to press the second substrate onto the first substrate; an air evacuating pipe configured to connect the confined chamber to a vacuum pump, to evacuate air from the confined chamber; an air inlet pipe connected to the confined chamber; and a two-stage valve assembly connected to the confined chamber via the air inlet pipe, wherein the two-stage valve assembly is configured to allow an outside atmosphere air to enter the confined chamber to raise a pressure in the confined chamber; wherein a flow coefficient of the two-stage valve assembly is configured to be selectively switched into a first flow coefficient and a second flow coefficient, and the second flow coefficient is greater than the first flow coefficient.

In one or more embodiments, when raising the pressure in the confined chamber, the two-stage valve assembly opens by the first flow coefficient for a predetermined time period, and then opens by the second flow coefficient.

In one or more embodiments, the two-stage valve assembly includes: a first shut-off valve and a throttle valve connected in series with the air inlet pipe, and wherein the first shut-off valve is disposed between the air inlet pipe and the throttle valve, and an equivalent flow coefficient of the first shut-off valve and the throttle valve connected in series equals the first flow coefficient; and a second shut-off valve with two ends respectively connected to an inlet end of the first shut-off valve and an outlet end of the throttle valve, and when the first shut-off valve and the second shut-off valve simultaneously open, an equivalent flow coefficient equals the second flow coefficient.

In one or more embodiments, when raising the pressure in the confined chamber, the first shut-off valve opens for a predetermined time period at first, and the second shut-off valve opens.

In one or more embodiments, the vacuum container includes an upper container and a lower container, and the upper container is combined with the lower container to define the confined chamber.

In one or more embodiments, the bonding apparatus further comprises a holder, disposed on the lower container and located within the confined chamber, wherein a holding surface of the holder faces the upper container for holding the first substrate.

In one or more embodiments, the bonding head is disposed to the upper container in a movable manner.

In one or more embodiments, the bonding apparatus further comprises a linear actuator disposed outside the upper container, wherein an actuator rod of the linear actuator passes through the upper container and connected to the bonding head, allowing the bonding head to move toward the holder.

Through the bonding method and apparatus of this disclosure, the air between the bonded substrates can be fully eliminated, and at the same time, air is prevented from re-entering between the two substrates during the pressure recovery process, effectively improving the bonding yield.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
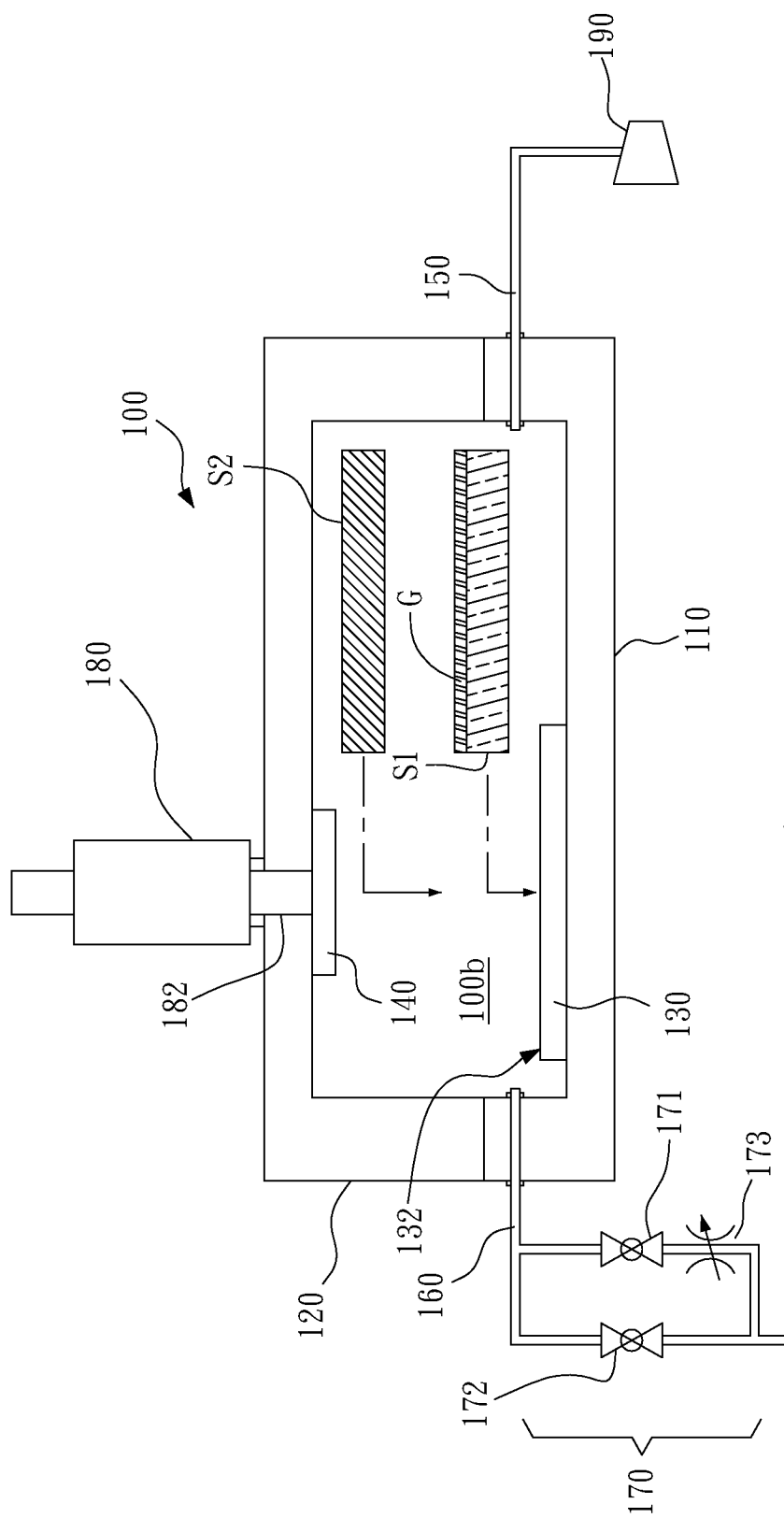
FIG. 1 is a cross-sectional view of a bonding apparatus according to an embodiment of this disclosure.
Figure 2:
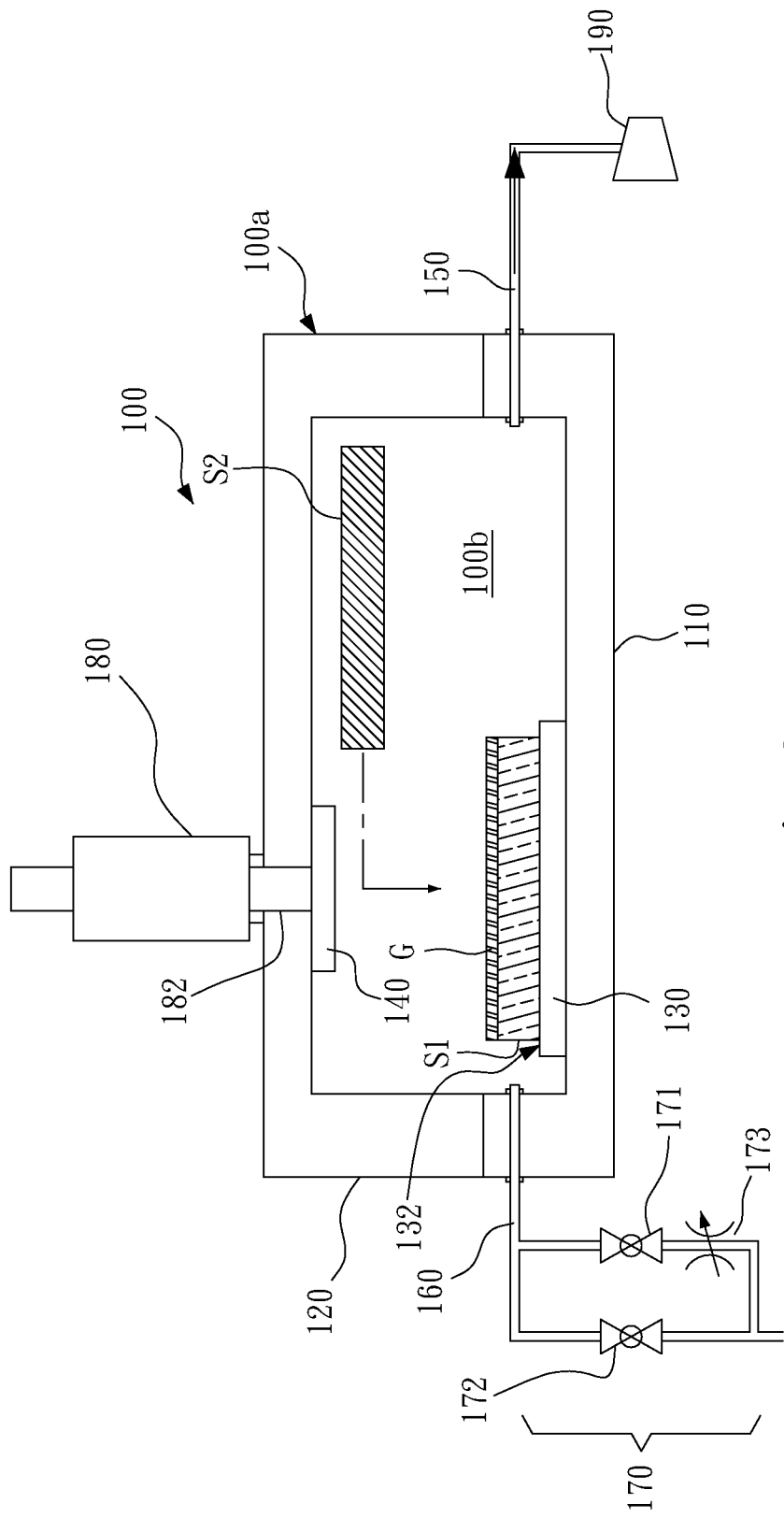
FIG. 2 is another cross-sectional view of the bonding apparatus according to the embodiment of this disclosure.
Figure 3:
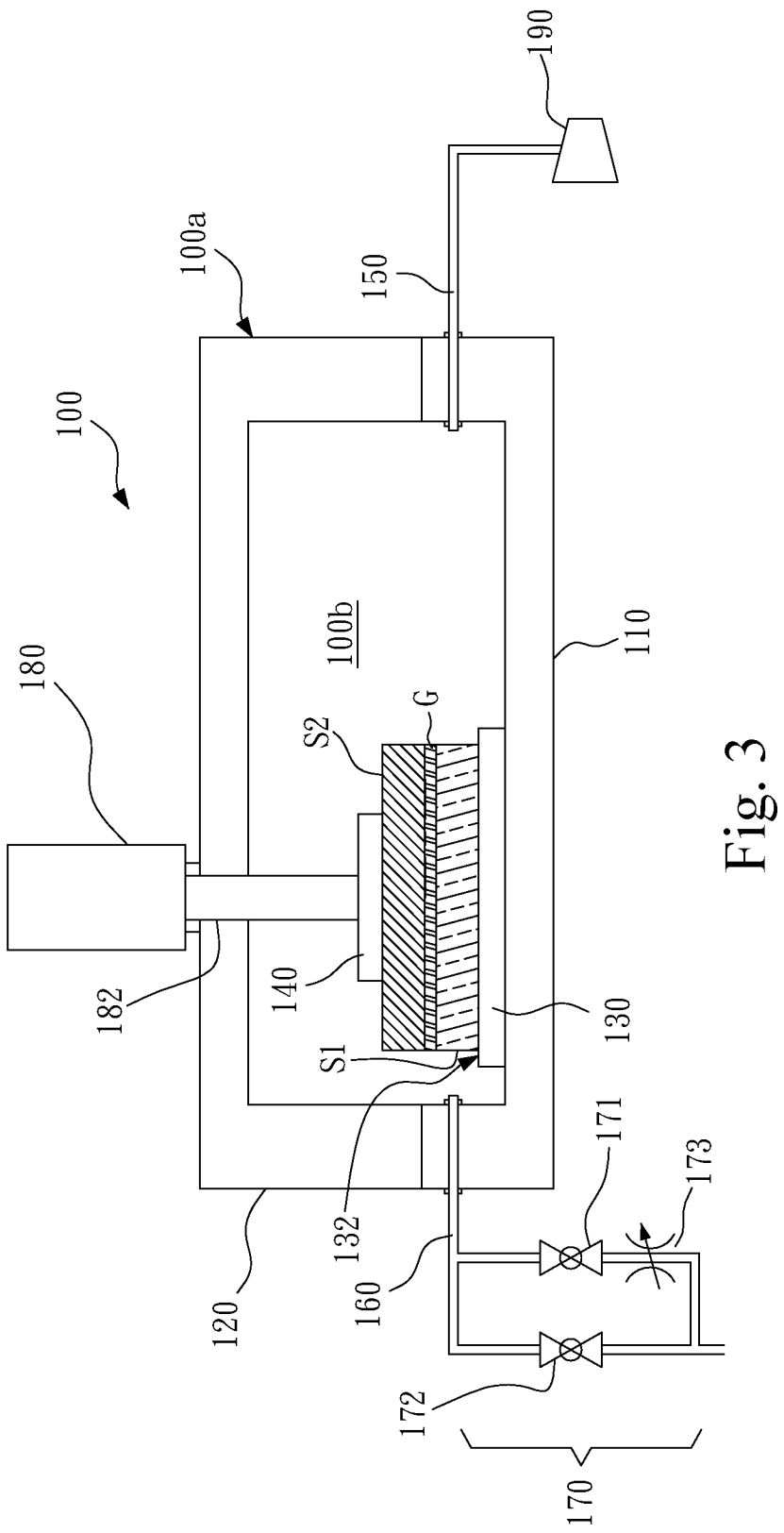
FIG. 3 is yet another cross-sectional view of the bonding apparatus according to the embodiment of this disclosure.

As shown in FIG. 1, FIG. 2 and FIG. 3, a bonding apparatus 100 for substrates according to an embodiment of this disclosure is shown, which is configured to perform a binding method to bond a first substrate S1 and a second substrate S2. The first substrate S1 and the second substrate S2 may be, but not limited to, a wafer to be thinned and a carrier plate for strengthening mechanical strength, It should be noted that The dimensional proportions of the first substrate S1 and the second substrate S2 drawn in the drawings is for the purpose of making this disclosure to be easily understood, it does not represent the actual size ratio of the first substrate S1 and the second substrate S2.

As shown in FIG. 1, FIG. 2 and FIG. 3, The bonding apparatus 100 includes a lower container 110, an upper container 120, a holder 130, a bonding head 140, an air evacuating pipe 150, an air inlet pipe 160, and a two-stage valve assembly 170.

As shown in FIG. 1, FIG. 2 and FIG. 3, the upper container 110 and the lower container 120 are combined to a vacuum container 100a, and a confined chamber 100b is defined within the vacuum container 100a. The lower container 110 forms the bottom of the vacuum container 100a, and the upper container 120 forms the top of the vacuum container 100a. The holder 130 is disposed on the bottom of the vacuum container 100a, that is the holder 130 is disposed on the lower container, and the holder 130 is located within the confined chamber 100b. A holding surface 132 of the holder 130 faces the top of the vacuum container 100a, that is the holding surface 132 faces the upper container 120. The holding surface 132 of the holder 130 is configured to hold the first substrate S1. Specifically, the lower container 110 may fixed to a base, and the upper container 120 is connected to a lifting device. Raising or lowering the upper container 120 by the lifting device, the upper container 120 and the lower container 110 are allowed to separate from each other to open the vacuum container 100a, or the upper container 120 is allowed to be combined with the lower container 110 to form the vacuum container 100a and the confined chamber 100b.

As shown in FIG. 1, FIG. 2 and FIG. 3, the bonding head 140 is disposed to the upper container 120 of the vacuum container 100a in a movable manner, such that the bonding head 140 is disposed to the top of the vacuum container 100a, and the bonding head 140 is located within the confined chamber 100b. The bonding head 140 is correspondingly disposed above the holder 130, and is configured to press the second substrate S2 onto the first substrate S1, such that an adhesive G between the two substrate is able to bond the second substrate S2 to the first substrate S1, and air between the first substrate S1 and the second substrate S2 is discharged.

As shown in FIG. 1, FIG. 2, and FIG. 3, specifically, the bonding apparatus 100 further includes a linear actuator 180 disposed outside the upper container 120. An actuator rod 182 of the linear actuator 180 passes through the upper container 120 and connected to the bonding head 140, to allow the bonding head 140 to move toward the holder 130 or away from the holder 130. An airtight shaft seal is provided at the joint of the actuator rod 182 and the upper container 120 to maintain the airtightness of the confined chamber 100b.

As shown in FIG. 1, FIG. 2 and FIG. 3, the air evacuating pipe 150 is disposed to the vacuum container 100a for connecting the confined chamber 100b to a vacuum pump 190. The vacuum pump 190 is configured to evacuate air from the confined chamber 100b, so as to vacuum the confined chamber 100b to a predetermined low-pressure value. Specifically, the air evacuating pipe 150 may be disposed to the lower container 110 or disposed to the upper container 120.

As shown in FIG. 1, FIG. 2 and FIG. 3, the air inlet pipe 160 is disposed to the vacuum container 100a for connecting the confined chamber 100b to exterior. Similarly, the air inlet pipe 160 may be disposed to the lower container 110 or disposed to the upper container 120.

As shown in FIG. 1, FIG. 2 and FIG. 3, the two-stage valve assembly 170 is connected to the air inlet pipe 160, so as to be connected to the confined chamber 100b via the air inlet pipe 160. A flow coefficient Cv of the two-stage valve assembly is configured to be selectively switched into a first flow coefficient Cv1 and a second flow coefficient Cv2, and the second flow coefficient Cv2 is greater than the first flow coefficient Cv1. The two-stage valve assembly 170 is configured to allow an outside atmosphere air to enter the confined chamber 100b to raise a pressure in the confined chamber 100b. When the two-stage valve assembly 170 opens and is switched to have the first flow coefficient Cv1, a pressure in the confined chamber 100b slowly raises. When the two-stage valve assembly 170 opens and is switched to have the second flow coefficient Cv2, the pressure in the confined chamber 100b rapidly raises to equalize with the outside atmosphere.

As shown in FIG. 1, FIG. 2 and FIG. 3, the two-stage valve assembly 170 includes a first shut-off valve 171, a throttle valve 173, and a second shut-off valve 172. The first shut-off valve 171 and a throttle valve 173 are connected in series with the air inlet pipe 160, and the first shut-off valve 171 is disposed between the air inlet pipe 160 and the throttle valve 173. Two ends of the second shut-off valve 172 is respectively connected to an inlet end of the first shut-off valve 171 and an outlet end of the throttle valve 173, that is the second shut-off valve 172 the inlet end of the first shut-off valve 171 to the outlet end of the throttle valve 173. The first shut-off valve 171 and the second shut-off valve 172 may be identical shut-off valves having the same fluid coefficient Cv. the throttle valve 173 is configured to regulate the flow rate of air through the second shut-off valve 172. The throttle valve 173 may be pre-regulated to such an extent that the first shut-off valve 171 in series with the throttle valve 173 provides a fluid coefficient Cv equal to the desired first fluid coefficient Cv1. And when the first shut-off valve 171 and the second shut-off valve 172 are opened simultaneously, the two-stage valve assembly 170 has an equivalent second fluid coefficient Cv2. And the second flow coefficient Cv2 is greater than the first flow coefficient Cv1.

Figure 4:
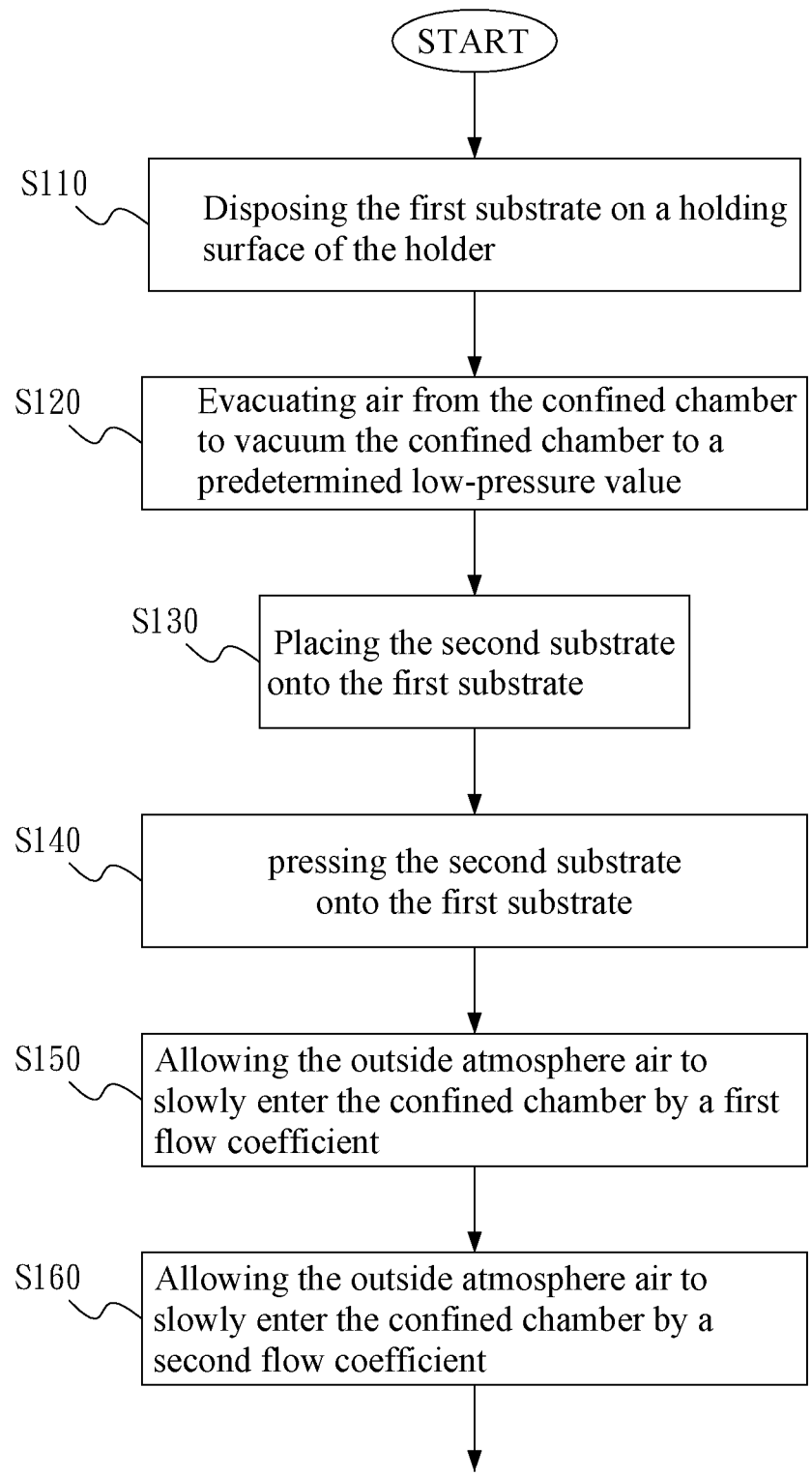
FIG. 4 is a flowchart of a bonding method according to the embodiment of this disclosure.

Referring to FIG. 4, a bonding method for substrates of this disclosure is shown.

As shown in FIG. 1, FIG. 2 and FIG. 4, first, the method is to dispose the first substrate S1 in the confined chamber 100b, wherein the first substrate S1 is placed on a holding surface 132 of the holder 130 at first, and the holder is disposed on a bottom of the vacuum container 100a, as shown in step S110.

The first substrate S1 may be placed in the confined chamber 100b that is half-open when the confined chamber 100b is not fully closed, i.e., when the upper container 120 is not yet combined with the lower container 110, and is disposed on the holding surface 132 of the bearing table 130. The first substrate S1 and the second substrate S2 may also be placed in the semi-open closed chamber 100b, and the first substrate S1 and the second substrate S2 may be grasped by a fixture or transfer tool (not shown). Next, the method is to combine the upper container 120 and the lower container 110 to form the confined chamber 100b. The first substrate S1 is then placed on the holding surface 132 of the holder 130 by means of clamps and transfer devices. The method may also be to place the first substrate S1 on the holding surface 132 of the holder 130 at first when the confined chamber 100b is half-open.

As shown in FIG. 2 and FIG. 4, have the confined chamber 100b to be airtight, such as by combining the upper container 120 with the lower container 110, and evacuate air from the confined chamber 100b by using a vacuum pump 190, so as to vacuum the confined chamber 100b to a predetermined low-pressure value, such as a low pressure close to a vacuum, as shown in step S120.

As shown in FIG. 3 and FIG. 4, place the second substrate S1 onto the first substrate S1, as shown in step S130. One of the first substrate S1 and the second substrate S2 may be coated with an adhesive G in advance, to have the adhesive G located between the first substrate S1 and the second substrate S2. The adhesive G may be coated on the upper surface of the first substrate S1 or coated on the lower surface of the second substrate S2.

In order to avoid the formation of air bubbles over a large area directly when the second substrate S2 is placed on top of the first substrate S1, the second substrate S2 may be tilted to be placed on the first substrate S1, the second substrate S2 is then gradually affixed to the first substrate S1 so that the large air bubbles can be slowly discharged.

Figure 5:
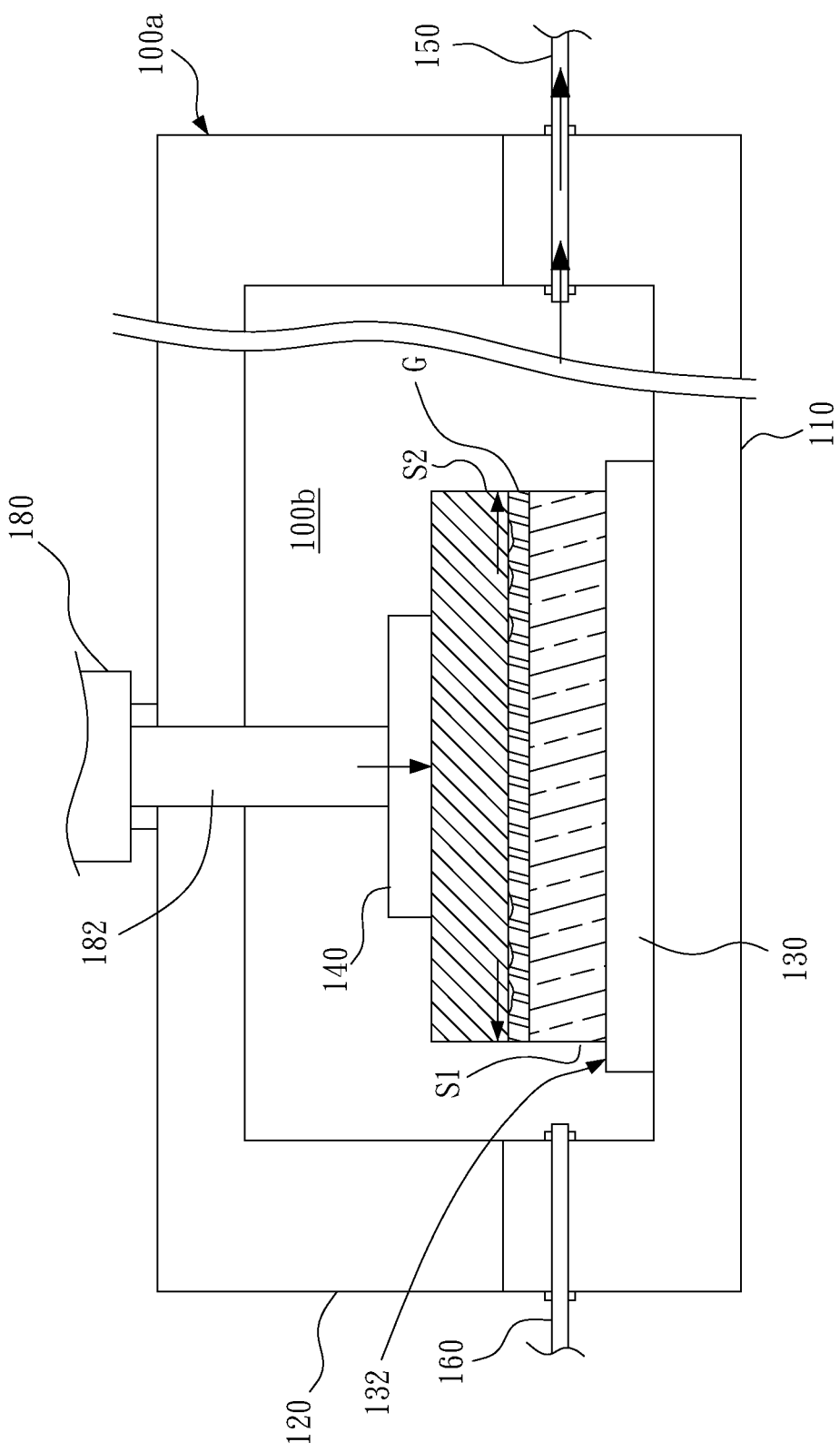
FIG. 5 is a cross-sectional view of the bonding apparatus showing part of the steps of the bonding method.

As shown in FIG. 3, FIG. 4 and FIG. 5, In a state where the pressure in the confined chamber 100a is low pressure, activate the linear actuator 180 to move the bonding head 140 toward the holder 130, such that the bonding head 130 contacts the second substrate S2 and then presses the second substrate S2 onto the first substrate S1 to form a bonded substrate, as shown in step S140.

As shown in FIG. 5, at the time, attracted by the low pressure of the confined chamber 100b, air bubbles remaining in the adhesive G, i.e., air bubbles between the first substrate S1 and the second substrate S2, will continue to move toward the edges of the bonded substrates, allowing the air between the first substrate S1 and the second substrate S2 to be discharged. Therefore, the first substrate S1 and the second substrate S2 can be well bonded by the adhesive G, avoiding discontinuities in the bonding of the adhesive G.

Figure 6:
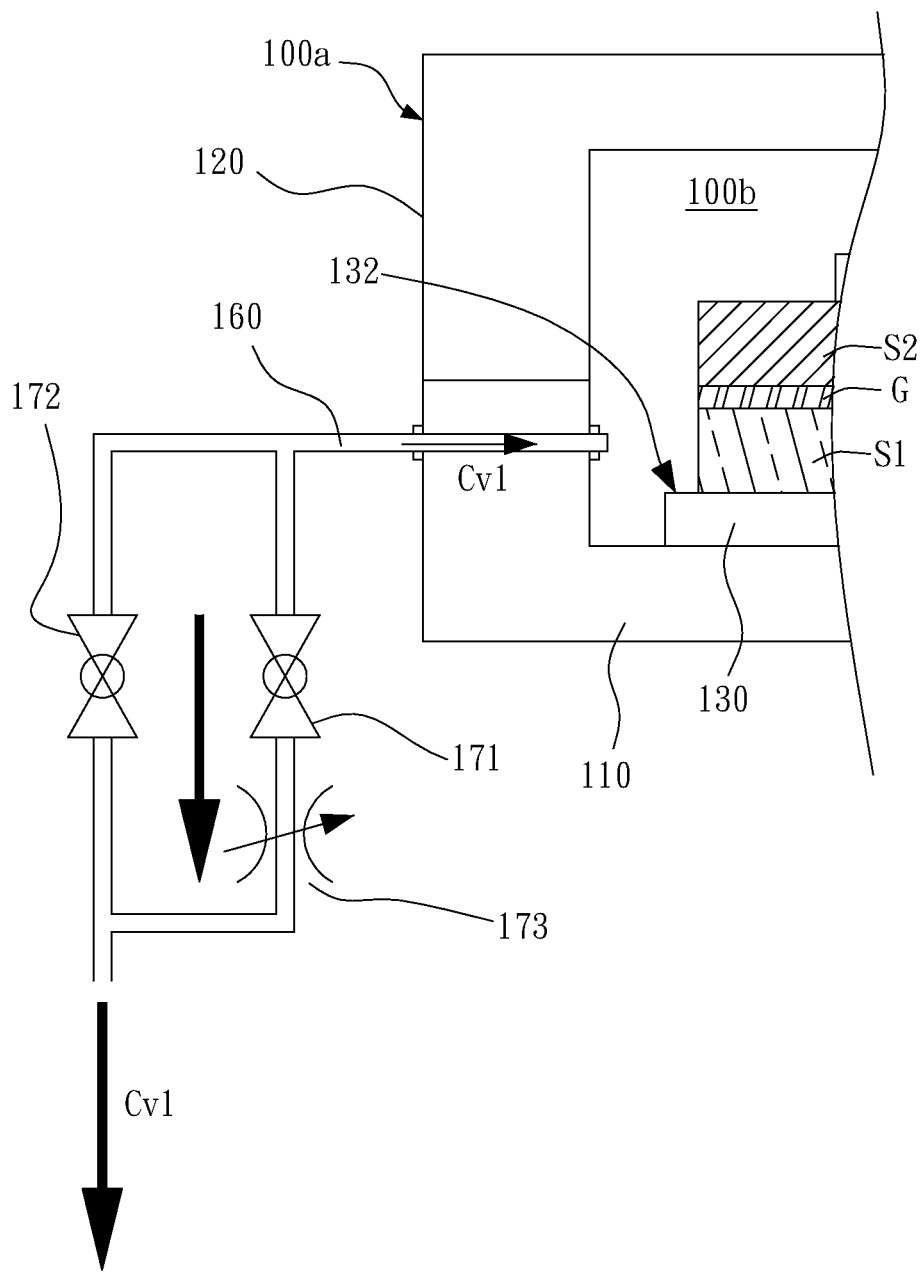
FIG. 6 and FIG. 7 are partial cross-sectional views of the bonding apparatus, showing part of the steps of the bonding method.

As shown in FIG. 4 and FIG. 6, then, open the first shut-off valve 171 to allow the outside atmosphere air to slowly enter the confined chamber 100b by the first flow coefficient through the throttle valve 173 and the first shut-off valve 171 of the two-stage valve assembly 170, such that the pressure in the confined chamber 100b raises slowly, as shown in step S150.

At the time, the confined chamber 100b remains relatively low-pressure state. Therefore, if there are still air bubbles B between the first substrate S1 and the second substrate S2, the air bubbles B can still be discharged by low pressure attraction. The slow rise in pressure also prevents air from re-entering between the first substrate S1 and the second substrate S2 and creating new air bubbles B.

Figure 7:
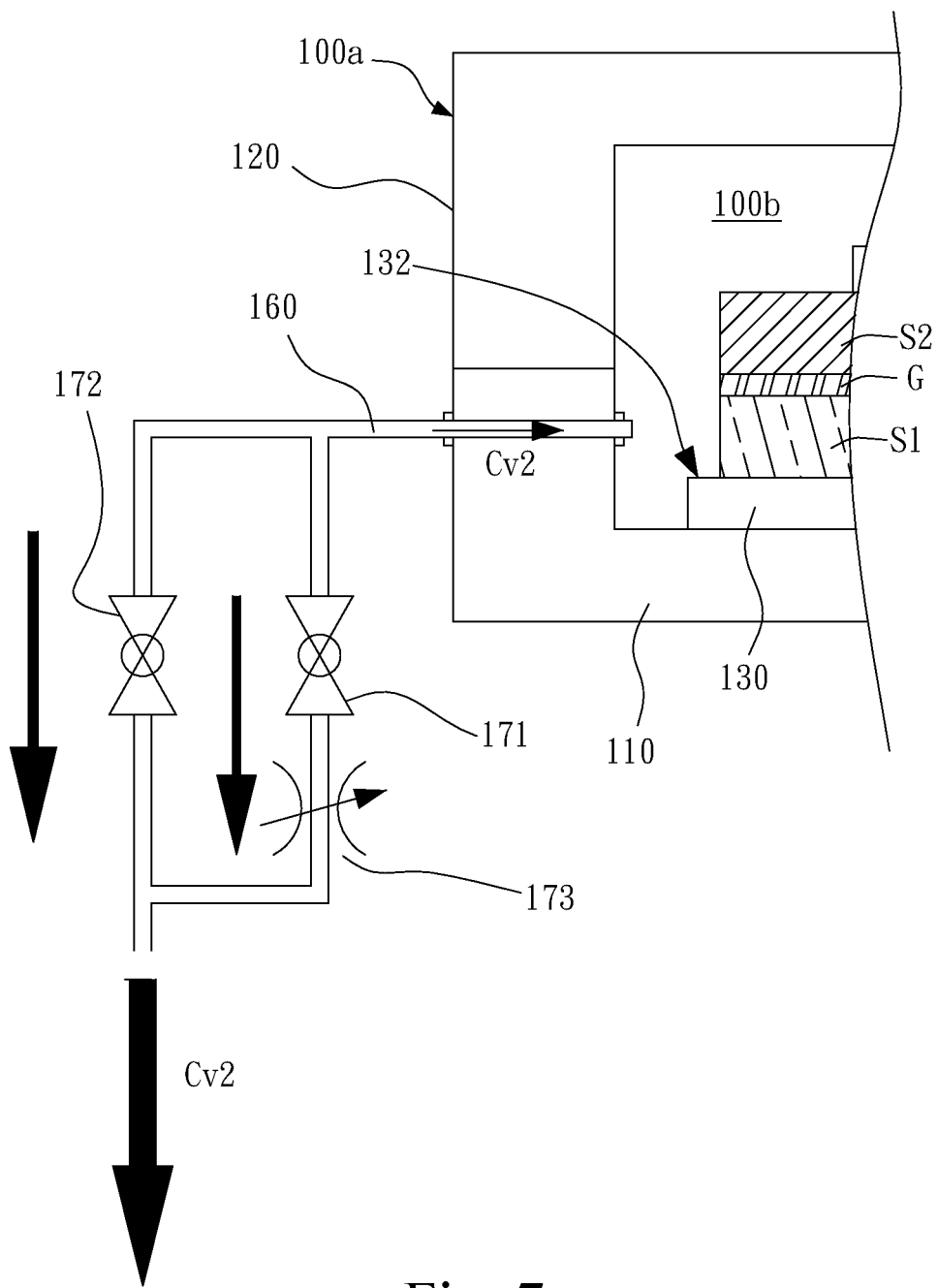

As shown in FIG. 4 and FIG. 7, After a certain pressurization time, the pressure inside the confined chamber 100b reaches a certain ratio to the outside atmospheric pressure. At this time, open the second opening valve 172 so that the outside atmospheric air also enters the confined chamber 100b through the second opening valve 172 simultaneously. At the time, the outside atmosphere air rapidly enters the confined chamber 100b through the first shut-off valve 171, the second shut-off valve 172, and the shut-off valve 173 of the two-stage valve assembly 170, such that the pressure in the confined chamber 100b raises rapidly to equalize with the outside atmospheric pressure, as shown in step S160.

Finally, the linear actuator 180 drives the bonding head 140 to leave the second substrate S2 and the upper container 120 is separated from the lower container 110 to open the vacuum chamber 100a, so as to take out the bonded substrates composed of the first substrate S1 bonded to the second substrate S2, and to complete the operation of the substrates bonding.

Through the bonding method and apparatus of this disclosure, the air between the bonded substrates can be fully eliminated, and at the same time, air is prevented from re-entering between the two substrates during the pressure recovery process, effectively improving the bonding yield.

What is claimed is:

1. A bonding method of substrates for bonding a first substrate and a second substrate, comprising:
    placing the first substrate on a holder in a confined chamber;
    evacuating air from the confined chamber to vacuum the confined chamber to a predetermined low-pressure value;
    placing the second substrate on a top of the first substrate;
    pressing the second substrate onto the first substrate;
    allowing an outside atmosphere air to enter the confined chamber by a first flow coefficient; and allowing the outside atmosphere air to enter the confined chamber by a second flow coefficient;
    wherein the second flow coefficient is greater than the first flow coefficient.

2. The bonding method as claimed in claim 1, wherein the first substrate is placed on a holding surface of the holder at first, wherein the holder is disposed on a bottom of a vacuum container with the holding surface facing a top of the vacuum container.

3. The bonding method as claimed in claim 1, wherein the step of evacuating air from the confined chamber comprises: connecting a vacuum pump to the confined chamber by an air evacuation pipe and evacuating air by the vacuum pump.

4. The bonding method as claimed in claim 1, wherein the step of pressing the second substrate comprises: disposing a bonding head to the top of a vacuum container in a movable manner, allowing the bonding head to move toward the holder to contact and press the second substrate.

5. The bonding method as claimed in claim 1, wherein the step of allowing the outside atmosphere air to enter the confined chamber by the first flow coefficient or the step of allowing the outside atmosphere air to enter the confined chamber by the second flow coefficient comprises: connecting a two-stage valve assembly to the confined chamber via an air inlet pipe; wherein a flow coefficient of the two-stage valve assembly is configured to be selectively switched into the first flow coefficient and the second flow coefficient.

6. The bonding method as claimed in claim 5, wherein the two-stage valve assembly includes:
    a first shut-off valve and a throttle valve connected in series with the air inlet pipe, wherein the first shut-off valve is disposed between the air inlet pipe and the throttle valve, and a first equivalent flow coefficient of the first shut-off valve and the throttle valve connected in series equals the first flow coefficient; and
    a second shut-off valve with two ends respectively connected to an inlet end of the first shut-off valve and an outlet end of the throttle valve, and when the first shut-off valve and the second shut-off valve simultaneously open, a second equivalent flow coefficient equals the second flow coefficient.

7. The bonding method as claimed in claim 6, wherein when allowing the outside atmosphere air to enter the confined chamber by the first flow coefficient, the first shut-off valve is opened to allow the outside atmosphere air to enter the confined chamber via the throttle valve and the first shut-off valve.

8. The bonding method as claimed in claim 6, when allowing the outside atmosphere air to enter the confined chamber by the second flow coefficient, the second shut-off valve is opened to allow the outside atmosphere air to enter the confined chamber simultaneously via the first shut-off valve, the second shut-off valve, and the throttle valve.

9. The bonding method as claimed in claim 6, further comprising: applying an adhesive to the first substrate or the second substrate, to allow the adhesive to be disposed between the first substrate and the second substrate.

* * * * *